(12) United States Patent
Macris

(10) Patent No.: US 6,818,817 B2
(45) Date of Patent: Nov. 16, 2004

(54) HEAT DISSIPATING SILICON-ON-INSULATOR STRUCTURES

(76) Inventor: Chris Macris, P.O. Box 2660, North Bend, WA (US) 98045

( * ) Notice: Subject to any disclaimer, the term of this patent is extended or adjusted under 35 U.S.C. 154(b) by 353 days.

(21) Appl. No.: 09/927,314

(22) Filed: Aug. 10, 2001

(65) Prior Publication Data

US 2002/0033189 A1 Mar. 21, 2002

Related U.S. Application Data

(63) Continuation-in-part of application No. 09/664,121, filed on Sep. 18, 2000.

(51) Int. Cl.[7] .......................... H01L 35/34; H01L 25/28; H01L 23/34; H01L 21/50
(52) U.S. Cl. .................... 136/201; 136/203; 257/713; 257/722; 428/118
(58) Field of Search .................. 136/200, 201, 136/203, 204, 242, 237; 62/3.2; 257/930, 712, 713, 718, 719, 722; 438/118, 54, 55, 48, 22, 458, 460, 106, 455, 107

(56) References Cited

U.S. PATENT DOCUMENTS

| | | | |
|---|---|---|---|
| 4,092,614 A | 5/1978 | Sakuma et al. | 331/94.5 P |
| 4,211,888 A | 7/1980 | Stein et al. | 136/225 |
| 5,022,928 A * | 6/1991 | Buist | 136/212 |
| 5,051,865 A | 9/1991 | Kato | 361/386 |
| 5,061,987 A | 10/1991 | Hsia | 357/71 |
| 5,229,327 A | 7/1993 | Farnworth | 437/209 |
| 5,598,031 A | 1/1997 | Groover et al. | 257/668 |
| 5,637,921 A * | 6/1997 | Burward-Hoy | 257/712 |
| 5,714,791 A | 2/1998 | Chi et al. | 257/467 |
| 5,724,818 A * | 3/1998 | Iwata et al. | 62/3.7 |
| 5,793,107 A | 8/1998 | Nowak | 257/717 |
| 5,837,929 A | 11/1998 | Adelman | 136/225 |
| 5,956,569 A * | 9/1999 | Shiu et al. | 438/48 |
| 6,080,608 A | 6/2000 | Nowak | 438/151 |
| 6,094,919 A * | 8/2000 | Bhatia | 62/3.7 |
| 6,121,661 A * | 9/2000 | Assaderaghi et al. | 257/355 |
| 6,162,659 A | 12/2000 | Wu | 438/106 |
| 6,166,411 A | 12/2000 | Buynoski | 257/347 |
| 6,196,002 B1 | 3/2001 | Newman et al. | 62/3.7 |
| 6,247,778 B1 * | 6/2001 | Iwata | 347/16 |

* cited by examiner

Primary Examiner—Patrick Ryan
Assistant Examiner—Thomas H. Parsons
(74) Attorney, Agent, or Firm—Jensen & Puntigam PS

(57) ABSTRACT

Heat dissipating Silicon-on-Insulator (SOI) structures which utilize thermoelectric effects to more effectively dissipate thermal energy from SOI-based electronic circuits.

50 Claims, 9 Drawing Sheets

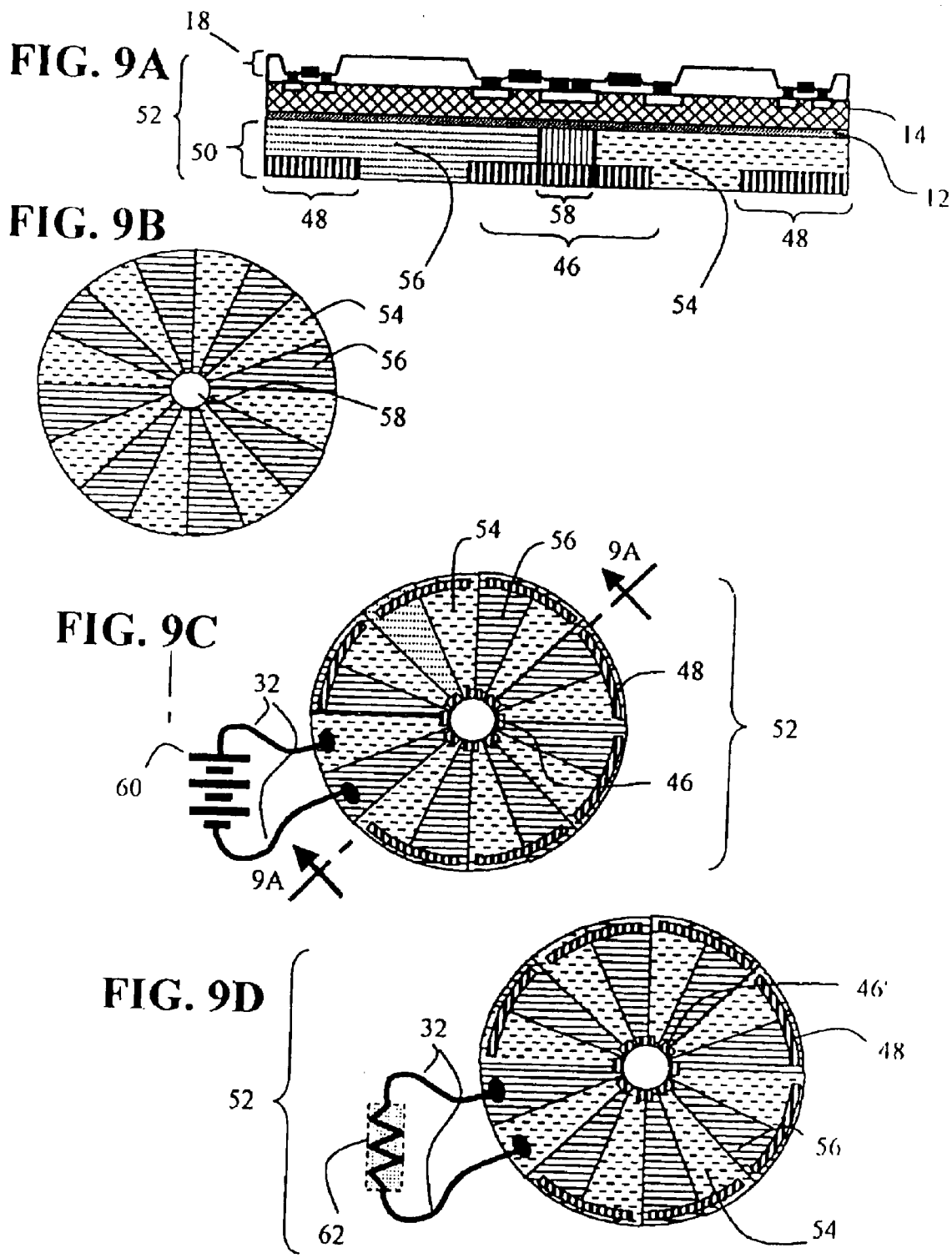

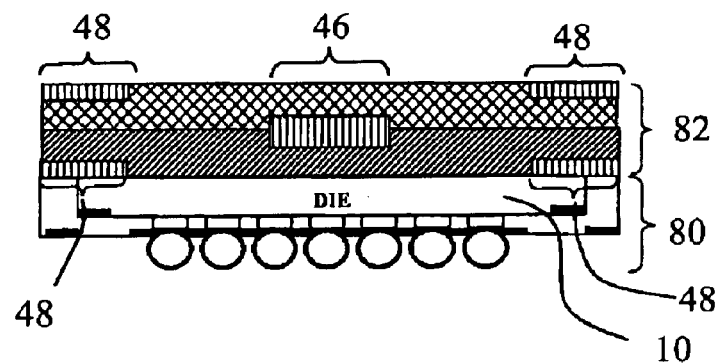
FIG. 12
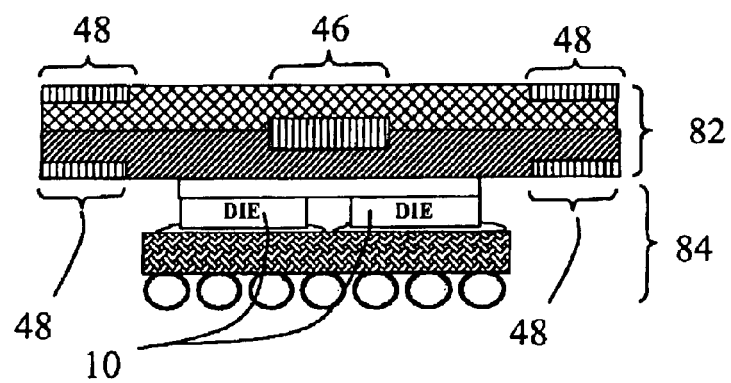
FIG. 13
FIG. 14
FIG. 15
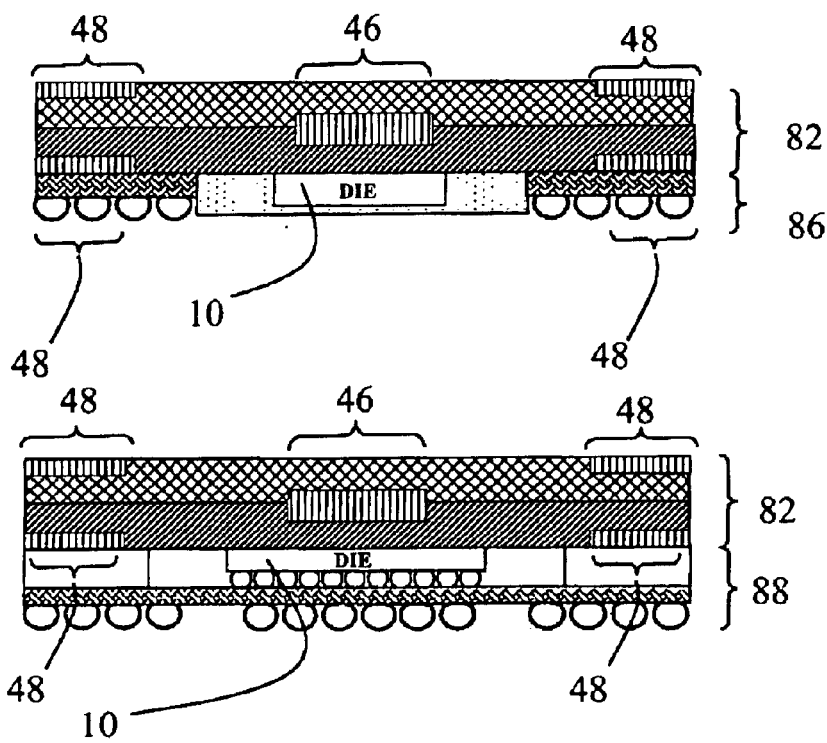

HEAT DISSIPATING SILICON-ON-INSULATOR STRUCTURES

CROSS-REFERENCE TO RELATED APPLICATIONS

The present invention is a continuation-in-part of, and claims priority from, U.S. patent application Ser. No. 09/664,121 filed Sep. 18, 2000, and still pending.

TECHNICAL FIELD

The present invention relates to the field of heat sink and heat spreader structures and, more particularly, to heat sink/spreader structures which utilize thermoelectric effects to more effectively dissipate thermal energy from Silicon-on-Insulator (SOI) based electronic devices.

BACKGROUND OF THE INVENTION

Silicon-on-insulator (SOI) technology involves the formation of a thin semiconducting layer overlying a layer of insulating material. This structure reduces the power consumption and capacitance of the fabricated transistors thereby allowing faster switching speeds.

Many processes have been developed to yield this type of wafer material. Separation by implantation of oxygen (SIMOX) involves the implantation of a silicon substrate with a layer of oxygen which forms the oxide layer below the substrate surface. A thin silicon layer is then deposited on the surface which allows the fabrication of integrated circuit devices.

Bond and etch-back (BESOI) is used to manufacture relatively thick films of both oxide and silicon. Two silicon wafers, one with an oxide layer, are bonded together using van der Waals forces and annealing. Finally, one side is thinned for device fabrication.

Smart Cut Technology combines implantation and wafer-bonding technologies. A wafer is oxidized and then hydrogen is implanted through the oxide to form cavities at the implantation range. The wafer is then bonded at 500 C. causing a merging of the hydrogen cavities and a delamination of the wafer's top section.

Although there are significant advantages associated with SOI technology, there are significant disadvantages as well. For example, poor heat removal from devices on an SOI substrate is a significant disadvantage. The oxide insulation layer has a markedly lower thermal conductivity than the thermal conductivity of conventional bulk silicon. For example, the thermal conductivity of silicon dioxide is about 1.4 W/m. degrees Celsius while the thermal conductivity of conventional bulk silicon is about 150 W/m. degrees Celsius.

To improve the thermal performance of an SOI-based electronics or integrated circuit device, heat sinks and heat spreaders are added either internally (bonded to the chip) or externally to the packages. However, the typical materials utilized exhibit a variety of shortcomings including: thermal expansion mismatch between the heat spreader and the chip, excessive weight, high cost, manufacturability issues and marginal thermal performance.

U.S. Pat. No. 6,166,411, granted to Buynoski on Dec. 26, 2000 discloses a method of fabricating SOI devices using metal substrates for heat removal. The metal substrate is coated with two oxide layers and is bonded (with heat and pressure) to an oxidized silicon wafer.

U.S. Pat. No. 6,121,661, granted to Assaderaghi, et al. on Sep. 19, 2000 discloses a silicon-on-insulator (SOI) structure in which trenches are etched from the active face of the silicon substrate, through the oxide layer and into the P-type substrate layer. These trenches are then filled with polysilicon, thereby creating "plugs" which help to dissipate heat from the circuitry (on the active face) to the substrate backside via the P-type substrate.

U.S. Pat. Nos. 5,793,107 and 6,080,608 granted to Nowak on Jun. 27, 2000 relates to polysilicon heat sink pillars formed on a silicon-on-insulator (SOI) wafer. Trenches, formed from the active face of the wafer through the oxide and to the P-type substrate, are filled with polysilicon and doped (N-type) to yield electrical isolation between the pillars and substrate.

Now, the field of Thermoelectricity relates to the thermodynamic effects of temperature differentials, electric potential gradients and current flow in single and multiple dissimilar electrical conductors or semiconductors. There are basically three effects which comprise this field including: the Seebeck Effect, the Peltier Effect and the Thomson Effect.

In 1821, Seebeck found that when two dissimilar conducting or semiconducting materials are joined to each other at both ends and if there is a temperature differential between these two ends, an EMF, or voltage, will be established within the two materials. This effect is called the Seebeck Effect. The effect arises because the presence of a temperature gradient in a material causes a carrier-concentration gradient and an electric field is established which causes the net flow of charge carriers when the conductors are joined into a closed electrical circuit.

In 1834, Peltier observed that heat was either liberated or absorbed at the junction of two dissimilar conductors or semiconductors when an electric current was passed through the junction. Measurements established that the rate of absorption or liberation of heat at the junction was directly proportional to the electric current. The effect arises because the potential energy of the charge carriers is in general different in the two conductors and also because the scattering mechanisms that govern the equilibrium between the charge carriers and the crystal lattice differ in the two conductors. Therefore, in order to maintain a conservation of energy as well as a conservation of charge when charge carriers move across the junction, energy must be interchanged with the surroundings of the junction. As in the case of the Seebeck Effect, the Peltier Effect cannot be ascribed to either material alone but rather is a consequence of the junction.

In 1857, Thomson found that an energy interchange with the surroundings took place throughout the bulk of a conductor if an electric current was allowed to flow while a temperature gradient existed in the conductor. The rate of energy absorbed or liberated per unit length was proportional to the product of the electric current and the temperature gradient. The reasons for the existence of the Thomson Effect are essentially the same as those that cause the Peltier Effect. However, the difference in the potential energy of the charge carriers and in the scattering mechanisms are the consequences of the temperature gradient and not of the inhomogeneities in the conductor.

Additionally, charge carriers which flow (induced by a voltage) from one region of any conductive or semiconductive material to another carry with them small quantities of heat energy. If the carriers originally at one temperature in the conductor are displaced to cooler surroundings, they must discharge their excess kinetic energy by collisions with the lattice, thereby maintaining a conservation of energy.

This process assists the normal thermal conduction of heat energy in the conductor, which would occur in the absence of charge carrier (electric current) flow.

By combining the electric charge induced (active) heat transfer mechanisms created by the thermoelectric effects with the thermal conduction/radiation (passive) heat transfer mechanisms of typical heat sink/heat spreader structures, a more effective heat management structure is produced.

SUMMARY OF THE INVENTION

Accordingly, it is the overall object of the present invention to develop and construct heat dissipating silicon-on-insulator (SOI) structures which utilize thermoelectric effects in order to more effectively transfer thermal energy from electronic circuitry fabricated from these structures.

One object of the present invention to provide a heat dissipating SOI structure in which the silicon substrate itself is part of a thermoelectric couple, which may have an external electric potential applied.

An additional object of the present invention provides a heat dissipating SOI structure comprising a thermoelectric couple with elements connected together at both ends. When subjected to a temperature gradient, an EMF and corresponding current is established within the couple resulting in the absorption and liberation of heat at these junctions without the need for external electrical power.

Another object of the present invention is to provide a heat dissipating SOI structure, comprising of simply an electrically conductive or semiconductive material, wherein the material has an external electric potential applied in order to induce multiple heat transfer effects through the structure.

In another object of the present invention, the thermoelectric couple or conductive material of the heat dissipating SOI structure is in electrical series with an external electric load such as an electronic component or other thermoelectric device.

In yet another object of the present invention, the thermoelectric couple or conductive material of the heat dissipating SOI structure is utilized as a resistive load for an electronic component or power supply circuit in order to reduce electrical power consumption of the system.

Still, another object of the present invention is to provide a heat dissipating SOI structure whereby the thermoelement couple, when subjected to a temperature gradient, provides electrical power to an external load.

A further object of the present invention is to provide unique methods of delivering electrical power to each thermoelement, conductor or substrate.

Another object of the present invention is to provide a heat dissipating SOI structure comprised of multiple thermoelectric couples, in a planar configuration.

In yet another object of the present invention, a cascaded, or multistage "planar" thermoelectric device structure is illustrated, wherein each successive stage is added to the horizontal plane. The heat absorbing junctions of the stage interfacing the heat source are located in the center of the structure and the heat rejecting junctions of the heat rejecting stage are located within the perimeter of the structure.

A further object of the present invention includes a single or multistage heat sink/spreader, each stage consisting of at least one thermoelement couple, in which all thermoelements are formed within the SOI substrate through selecting doping techniques. Various electrical isolation techniques are additionally disclosed.

An additional object is to reduce the coefficient of thermal expansion mismatch between integrated heat spreaders and SOI structures.

Lastly, it is an object of the present invention to combine all of these unique design aspects and individual fabrication techniques into effective and manufacturable heat dissipating SOI structures.

BRIEF DESCRIPTION OF THE DRAWINGS

FIGS. 9a through 9d illustrate an electrical series of dissimilar thermoelements integrated with (or attachable to) an SOI substrate whereby either power is applied to or generated by the structures.

FIG. 12 illustrates a CSP electronic component package for housing the silicon substrate in the present invention.

FIG. 13 illustrates a FCMCM electronic component package for housing the silicon substrate in the present invention.

FIG. 14 illustrates a wire-bonded TBGA electronic component package for housing the silicon substrate in the present invention.

FIG. 15 illustrates a FCBGA electronic component package for housing the silicon substrate in the present invention.

BEST MODE FOR CARRYING OUT THE INVENTION

Described below are several embodiments of the present invention which illustrate various ways the present invention can be implemented. In the descriptions that follow, like numerals represent like elements in all figures. For example, where the numeral 10 is used to refer to a particular element in one figure, the numeral 10 appearing in any other figure refers to the same element.

Figure 1:
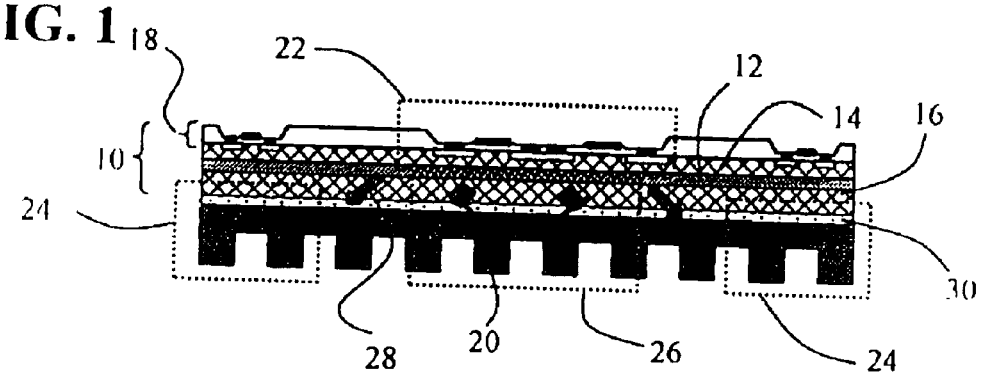
FIG. 1 is a pictorial representation illustrating conductive heat flow paths in a typical heat sink when interfaced with a heat source such as a SOI integrated circuit.

As seen in FIG. 1 (sectional view), a SOI structure 10 is illustrated, which includes a buried oxide layer 12 interposed between a silicon layer 14 and a silicon substrate 16, the substrate typically of P-type conductivity. It can also be seen that an active circuitry layer 18 is fabricated from the thin silicon layer 14.

This SOI structure's 10 silicon substrate 16 is bonded (with a dielectric layer 30) to a heat sink 20 (comprised of a conductor or semiconductor) to dissipate excess thermal energy generated by the heat generating circuitry layer 18. Circuit architectures and the SOI's thermal resistance usually result in a higher concentration of heat near the SOI center region 22. Due to the further densification of electronic device packages, the heat sink may be significantly larger in length and width than that of the heat source (circuitry) in order to dissipate enough heat per given time. As thermally conducted heat 28 moves outward from the SOI center region 22 and through the heat sink 20, the sink perimeter regions 24 do not receive as much heat as the sink center region 26 immediately adjacent the SOI center region 22. As a result, thermal spreading resistance becomes a major limiting factor in the heat sink's ability to dissipate heat to the surrounding ambient environment.

Figure 2:
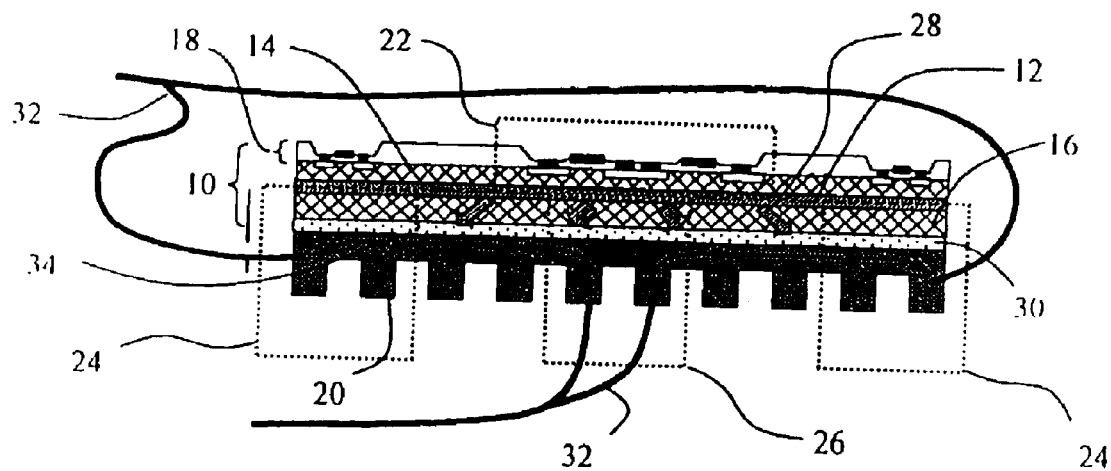
FIG. 2 illustrates the utilization of multiple heat transfer effects in the present invention.

FIG. 2 (sectional view) illustrates how an electrical conductor or semiconductor, carrying an electric current, can induce various heat transfer effects such as the Peltier Effect, Thomson Effect and the ability of charge carriers to carry thermal energy when under the influence of a voltage.

Similar to FIG. 1, the SOI structure 10, coupled to a heat sink 20 (via a dielectric bonding layer 30), again has a center region 26, which receives most of the thermally conducted heat 28 from the SOI center region 22. In this example, however, an electric potential is applied (via power leads 32) across the heat sink 20 and charge carrier flow 34 (electron flow in metals, electron and hole flow in N and P-type semiconductors respectively) absorbs heat energy from the sink center region 26 and dissipates the heat to the sink perimeter regions 24, resulting in higher heat sink efficiency. This thermal anisotropy, or directional heat transfer, is more effective at removing thermal energy from a localized heat source than conventional materials such as metals.

Figure 3:
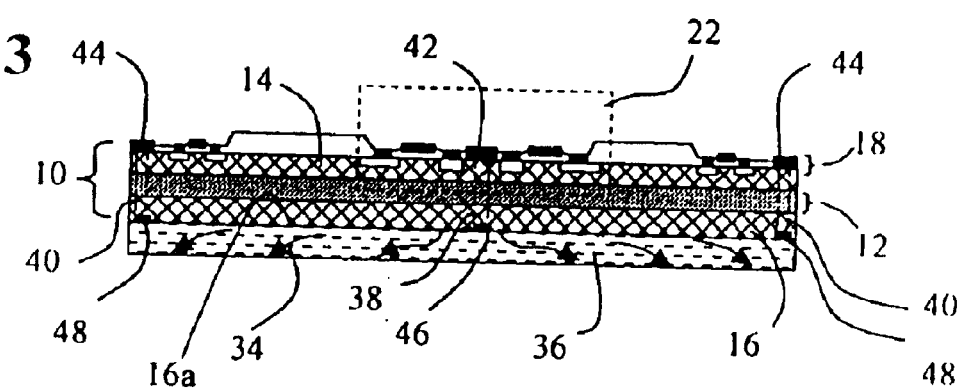
FIG. 3 illustrates active heat transfer paths resulting from an application of current in one embodiment of the present invention.

As shown in FIG. 3 (sectional view), the SOI structure 10 is attached to a conductor or semiconductor 36 via the silicon substrate 16 backside 16a. Attachment may be achieved through the use of wafer bonding illustrated in FIGS. 7a through 7c. In this particular embodiment, electrically conductive vias 38, 40 penetrate the silicon layer 14, oxide layer 12 and silicon substrate 16 thereby connecting the conductor 36 to contacts 42, 44 located within the active circuitry layer 18. The resultant connection between the center via 38 and conductor 36 creates a heat absorbing junction 46 near the center of the substrate. Likewise, the connections between the perimeter vias 40 and conductor 36 create heat rejecting junctions 48 near the perimeter of the substrate. Power supplied to the conductor 36 induces charge carrier flow 34 and resultant heat transfer from the hotter region on the conductor 36 (via the heat absorbing junction 46) outward (laterally) to the heat rejecting junctions 48 on the conductor's perimeter. Of course, the actual direction of charge carrier flow 34 (and therefore the determination of junction types) is dependant upon the voltage polarity as applied to the conductor 36.

Figure 4:
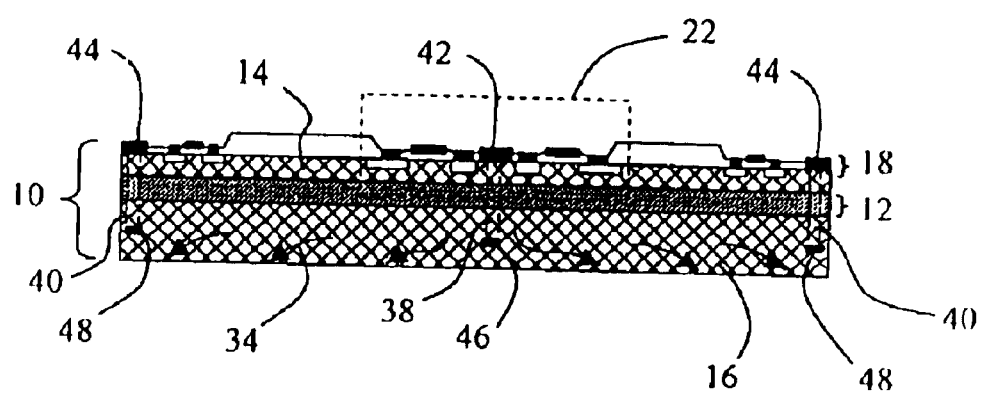
FIG. 4, another embodiment of the present invention, illustrates a means of supplying power to the heat dissipating structure.

FIG. 4 (sectional view) differs from FIG. 3 in that the silicon substrate 16 is provided with power (through the vias 38, 40) from the silicon layer thereby inducing charge carrier flow 34 to move heat from the hotter SOI center region 22 toward the substrate 16 perimeter. In order to increase the heat transfer efficiency of the substrate 16, dopants may be added to decrease its electrical resistance. Additionally, the substrate 16 may (at least partially) be doped to yield an N-type layer in order to further increase electrical conductivity.

Figure 5A:
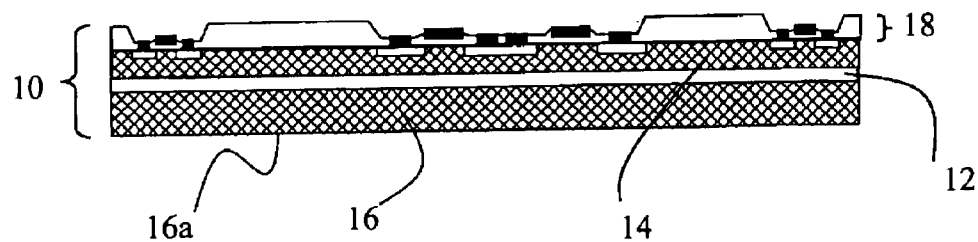
FIGS. 5a through 5c one method of fabricating thermoelement couples onto an SOI substrate.
Figure 5B:
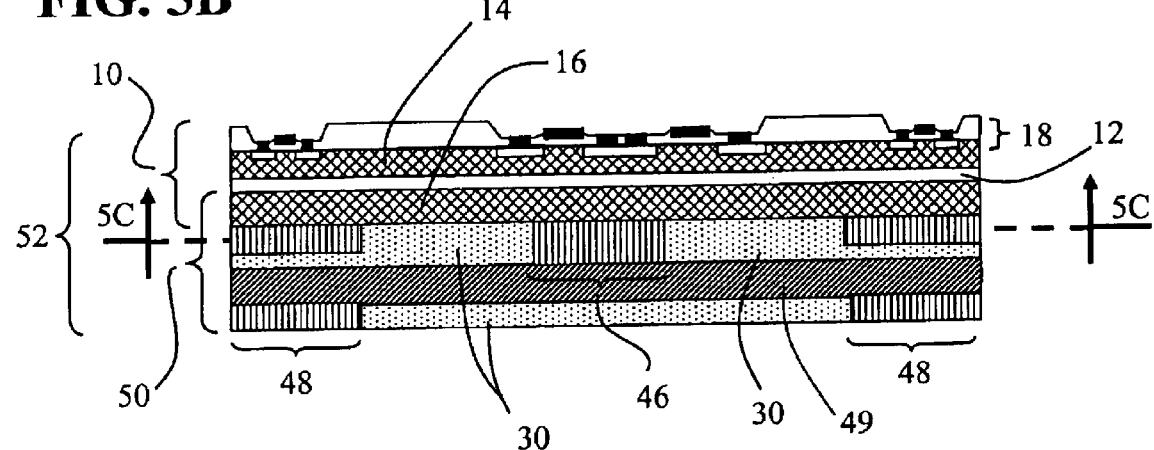
Figure 5C:
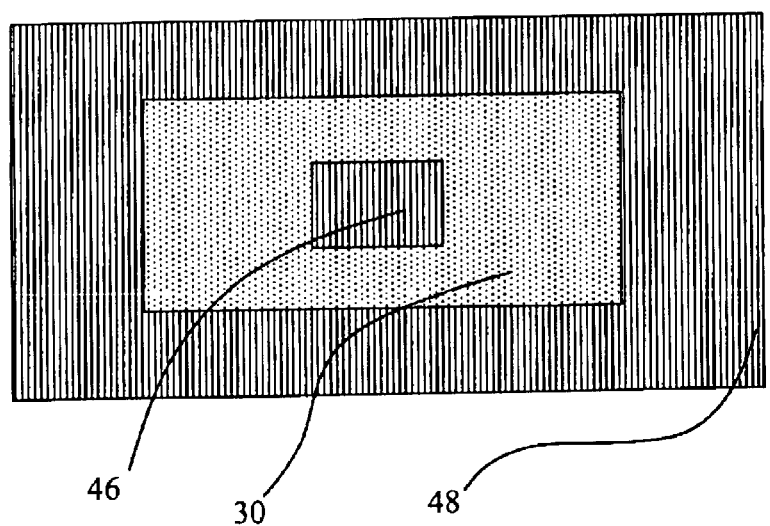

FIGS. 5a through 5c demonstrate the process flow for the fabrication of a heat dissipating SOI structure of the present invention.

Seen in FIG. 5a, a SOI structure 10 (sectional view) is comprised of similar components seen in previous figures.

In FIG. 5b, an electrical conductor or semiconductor 49 (dissimilar in composition to the silicon substrate 16) is bonded to the silicon substrate 16 via a heat absorbing junction 46 and a heat rejecting junction 48, both junction types 46, 48 laterally positioned relative to each other. The heat absorbing junction 46 (located near the center of the silicon substrate) and the heat rejecting junction 48 (located near the perimeter of the silicon substrate) may be comprised of a conductive material or the same material as the semiconductor 49.

The addition of junctions 46, 48 bonding the semiconductor 49 to the silicon substrate 16 (creating a thermoelement couple) results in a heat sink/spreader structure 50. The integration of this structure 50 with the SOI structure 10 thereby yields an efficient heat dissipating SOI structure 52.

The substrate 16 may (at least partially) be doped to yield an N-type layer in order to further increase electrical conductivity. In order to maintain planarity of the structure's backside 52b and to mitigate thermal resistance between the structure and external heat sink, a dielectric layer 30 is added between the junctions 46, 48. Additionally, the junctions 46, 48 may be embedded (flush) in the substrate 16, eliminating the need for the dielectric.

FIG. 5c (a sectional view of FIG. 5b on lines 5c—5c) illustrates the bottom view of the heat absorbing junction 46 and heat rejecting junction 48 with the dielectric layer 30 interdispersed on the silicon substrate's backside 16a. With the application of a voltage across the thermoelement couple, thermal energy will be transferred from the heat absorbing junction 46 (located in the center of the SOI structure 10) laterally through the substrate 16 and semiconductor 49 and dissipated at the heat rejecting junctions' 48 regions located around the entire perimeter. Electric power connections (not shown) to the junctions 48 can include internal vias (connecting the silicon layer to the substrate 16) or external leads.

FIGS. 6a through 6e illustrate another heat dissipating SOI structure of the present invention.

Figure 6A:
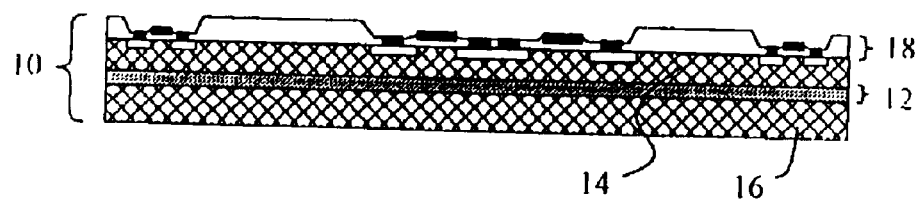
FIGS. 6a through 6c another method of fabricating the present invention.

As seen in FIG. 6a, a SOI structure 10 is comprised of similar components seen in previous figures.

Figure 6B:
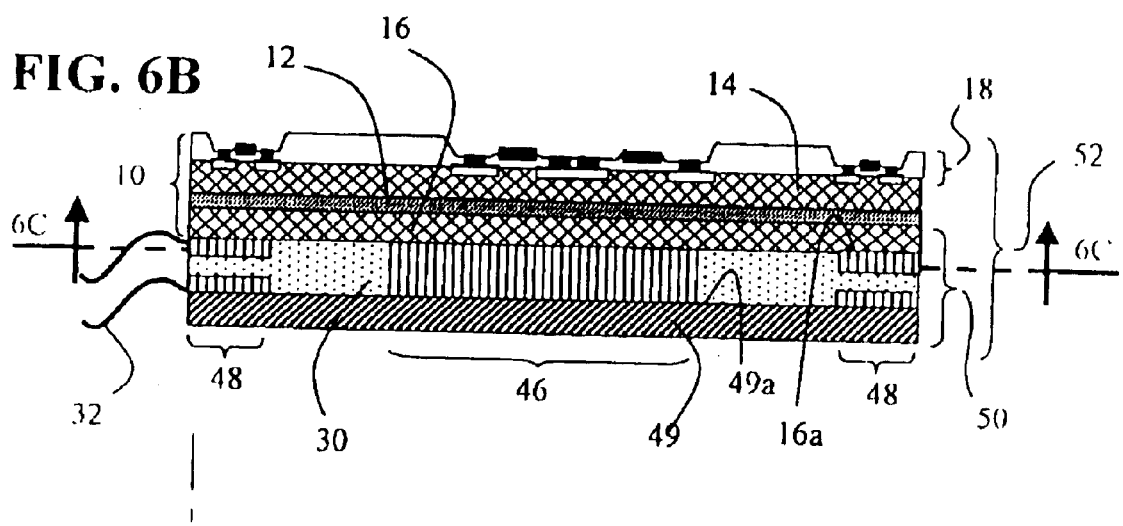

FIG. 6b comprises a dissimilar conductive or semiconductive thermoelement (comprised of at least one layer) 49 electrically bonded at a heat absorbing junction 46. Additionally, a dielectric layer 30 is selectively deposited over the opposing faces 16a, 49a of the substrate 16 and semiconductor 49 and their heat rejecting junctions 48 thereby providing a thermal bond between the substrate 16 and semiconductor 49.

Figure 6C:
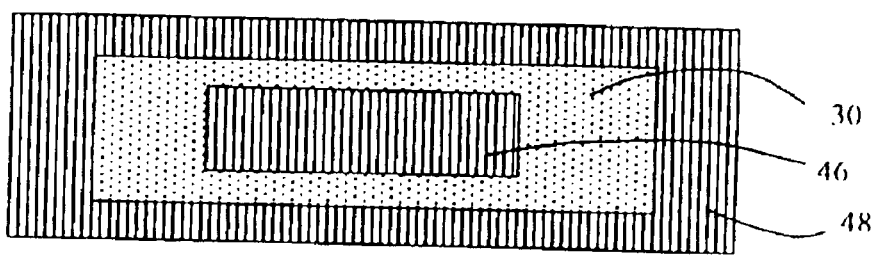

Within FIG. 6c (a sectional view of FIG. 6b on lines 6c—6c) the heat absorbing junction 46 (electrically bonding both the substrate 16 and semiconductor 49) is positioned near the center of the substrate 16 (center of the SOI structure 10) and the heat rejecting junction 48 (representing the heat rejecting junctions on the substrate 16 and and semiconductor 49) is positioned near the perimeter of the substrate 16 and SOI structure 10.

Figure 7A:
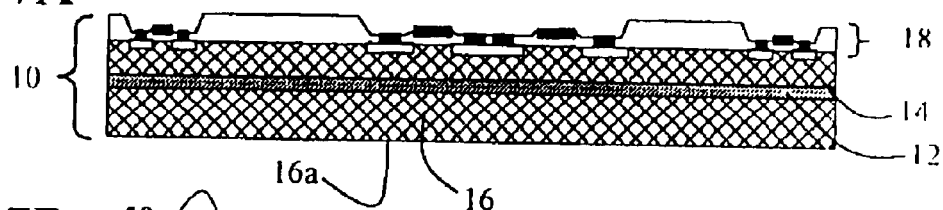
FIGS. 7a through 7c illustrates a method of manufacture involving wafer bonding of a heat dissipating structure to a SOI wafer.
Figure 7B:
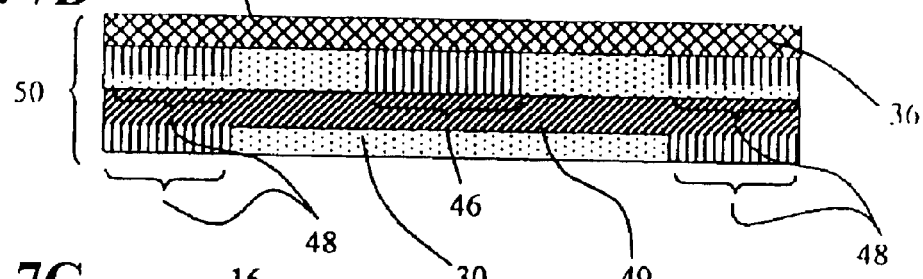
Figure 7C:
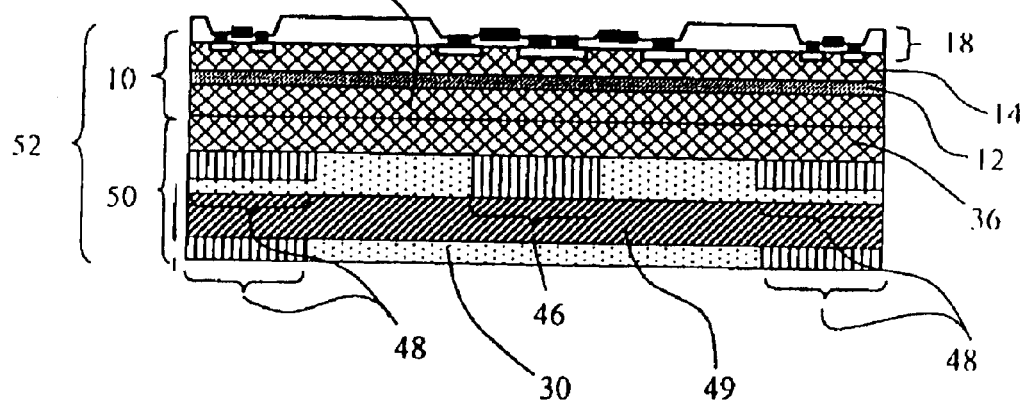

FIGS. 7a through 7c illustrate the wafer bonding of a SOI structure 10 to a discrete heat sink/spreader structure 50 in order to create a heat dissipating SOI structure 52 of the present invention.

FIG. 7a illustrates a typical SOI structure 10 seen in previous figures.

FIG. 7b depicts a heat sink/spreader structure 50 (similar in composition to the structure 50 seen in FIG. 5b) wherein a thermoelement couple is created through the bonding (at a heat absorbing junction 46) between a conductor or semiconductor 36 (preferably silicon) to at least one dissimilar conductor or semiconductor 49. The dissimilar conductors 36, 49 comprise at least one heat rejecting junction 48 each located near the perimeter of the structure 50. In this embodiment, the face 50a (of the structure 50 opposite the junctions 46, 48) will be wafer bonded to the exposed face 16a of the silicon substrate 16 (seen in FIG. 7a) to yield a heat dissipating SOI structure 52 seen in FIG. 7c.

There are several wafer bonding techniques that can be used to achieve different bonds. These can be classified as anodic, direct, or intermediate-layer bonds. The last category includes eutectic and glass-frit bonds. The general process of wafer bonding can be summarized as a three-step sequence: surface preparation, contacting, and annealing. Wafer bonding in the present invention may utilize, but is not limited by the specific techniques disclosed.

Anodic bonding relies on charge migration to produce bonded wafers. This usually involves a silicon wafer and a glass wafer or layer with a high content of alkali metals. In this approach, the presence of mobile metals is exploited by applying a high negative potential to the glass to attract the positive ions (Na+) to the negative electrode, where they are neutralized. The bond is performed at temperatures of up to 500° C., which increases the mobility of the positive ions. Furthermore, driven by the existing electric field, oxygen from the glass is transported to the glass-silicon interface where it combines with silicon to form SiO2, which creates a permanent bond.

Silicon direct wafer bonding (DWB), also known as fusion bonding, is performed by joining two silicon wafers together. This is done by creating hydrophobic or hydrophilic surfaces that are brought into contact and annealed at high temperatures. The bond is originated by pressing in the middle of one of the wafers to create an initial point of contact while mechanical spacers keep the wafers physically separated. Subsequent heating dehydrates the surface and causes a number of processes to take place. The hydroxyl groups form water molecules that in turn promote the oxidation of the bonding surfaces, creating a Si—O—Si bond as the hydrogen diffuses away.

In eutectic and glass-frit bonding, intermediate films are deposited before the bond; these are metallic in the former case and glass in the latter. The alloy is formed by solid-liquid interdiffusion at the interface, followed by solidification upon cooling. Pressure is applied while the wafers are maintained at the appropriate temperature.

With Glass-frit bonding, a thin glass layer is deposited and preglazed. The wafers are then brought into contact at the rated melting temperature of the glass, which is always <600° C. Pressure is also applied to keep the samples in intimate contact.

Any one of the techniques mentioned is capable of creating the resultant heat dissipating SOI structure 52 seen in FIG. 7c and many other illustrated embodiments of the present invention.

In one embodiment of the present invention, a heat dissipating SOI wafer (comprising more than one die or chip) is created by wafer bonding a top silicon wafer to a bottom silicon wafer via an oxide layer. The oxide layer may be formed on at least one face of either the top wafer or the bottom wafer or both wafers. Circuitry layers will later be fabricated on the top silicon wafer's face opposite the face to be bonded to the bottom wafer. Upon completion of the circuit fabrication, the heat dissipating SOI wafer will be separated into more than one final SOI die or chip.

The bottom silicon wafer comprises at least one thermoelement couple, each constructed from at least two dissimilar thermoelements electrically bonded to at least one heat absorbing junction and more than one heat rejecting junction. The thermoelements (comprising the thermoelement couple) may be formed by depositing P and N-type dopants into at least one face of the bottom silicon wafer to form a pattern of dissimilar conductivity silicon thermoelements.

Within the boundary of each die on the heat dissipating SOI wafer, thermoelement couples (comprising the bottom silicon wafer) are arranged such that their heat absorbing junctions are positioned near the center of each final SOI wafer die and the heat rejecting junctions are positioned near the perimeter of each final SOI wafer die.

Additionally, each final SOI die may comprise more than one thermoelement couple stage (within the bottom silicon wafer) wherein each successive stage is laterally positioned from the previous stage and the center of the final SOI die. Each stage may be positioned outside the entire perimeter of the previous stage and each successive stage.

A voltage may be applied to the thermoelement couple to transfer heat from the center of each final SOI die to the perimeter via the Peltier Effect.

Figure 8:
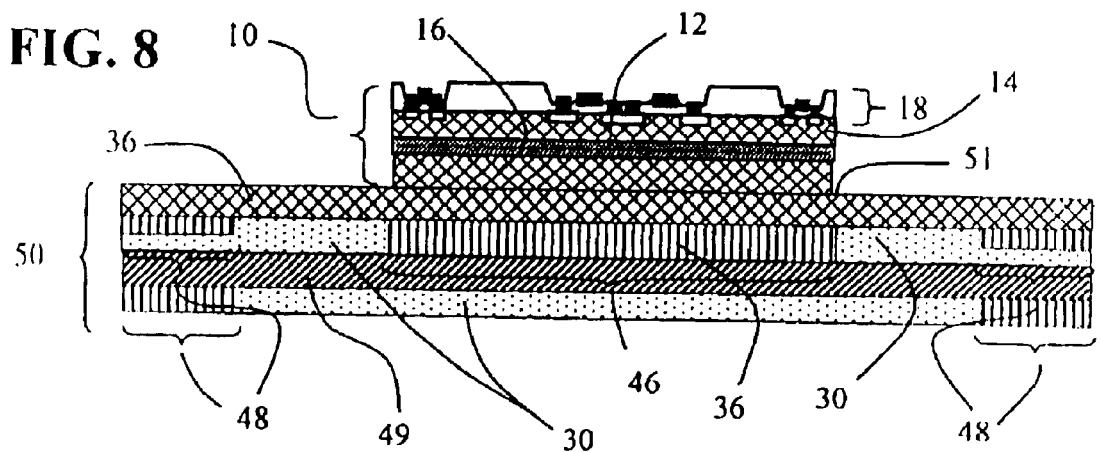
FIG. 8 illustrates another embodiment of the present invention utilizing wafer bonding.

FIG. 8, similar to the heat dissipating structure 52 (seen in FIG. 7c), utilizes a heat sink/spreader structure 50 whose surface area is larger than that of the SOI structure 10 it is wafer bonded to. It can be seen that the heat absorbing junction 46 surface area and location correlates with that of the bonded SOI structure 10. However, the heat rejecting junctions 48 are located outside the bond line 51 between the spreader structure 50 and SOI structure 10. As previously discussed, a large heat load may require additional surface area of the heat sink to dissipate enough thermal energy. The increased surface area of the spreader structure 50 will boost the dissipating efficiency of a coupled heat sink (not shown) by effectively moving heat laterally over a larger area.

FIGS. 9a through 9d illustrate a heat dissipating SOI structure comprising multiple thermoelement couples electrically in series. It can also be seen that the thermoelement couples can be supplied power (to move heat) or generate power from any difference in temperature between the heat absorbing junctions 46 and heat rejecting junctions 48.

FIG. 9a, a sectional view of FIG. 9c on lines 9a—9a, depicts a SOI structure 52 in which the silicon substrate 16 is selectively doped with P-type and N-type dopants to form a continuous alternating pattern of P-type and N-type conductivity thermoelements 54, 56 around a small via 58. The thermoelements 54, 56 are electrically bonded (through the use of an additional conductor or by directly bonding each P and N-type thermoelement together) thereby forming thermoelement couples with the heat absorbing junctions 46 near the center of the substrate and heat rejecting junctions 48 near the perimeter.

The bottom view seen in FIG. 9b clearly illustrates the distinctive dissimilar P-type and N-type thermoelements 54, 56 and small via 58 (in the substrate 16) necessary to achieve the pattern of thermoelement couples. Electrical isolation may be provided by the depletion regions established between the silicon substrate 16 and each doped discrete thermoelement 54, 56. Also, a dielectric, such as an oxide or nitride, may be added to the physical regions between each P and N-type conductivity thermoelement 54, 56. Additionally, the physical regions between each P and N-type thermoelement 54, 56 may be removed (chemically or mechanically) in order to maintain electrical insulation between each thermoelement.

Within FIG. 9c (bottom view), the heat absorbing junctions 46 and heat rejecting junctions 48 are visible along with leads 32 making an electrical connection to a power source 60. The structure 52 may also be electrically in series with an electrical load other than itself, such as an integrated circuit or other electronic component. In this way, the electrical current draw by both the electronic component and structure 52 will be interconnected. As the heat source demands more current, more heat must be removed and thus, the heat dissipating SOI structure 52 (electrically in series) will also receive additional current, which will increase heat transport capacity. Any embodiment of the present invention may be connected electrically in series with another load, such as the embodiment illustrated here in FIGS. 9a through 9c.

In another embodiment of the present invention, the power requirement of the heat dissipating SOI structure 52 can be augmented by utilizing its own internal electrical resistance as a resistive load for an electronic component or power supply circuit. In one example, voltage positioning is utilized by some CPU circuits to reduce power consumption. The CPU's core voltage, reduced as the power load increases, is controlled with power supply ICs which implement a droop resistor. This low ohmic value resistor, placed in the load's (CPU) path, consumes some of this power thereby reducing power efficiency of the system. By combining the power requirements of both the droop resistor and the heat dissipating structure 52, CPU power can be reduced and heat generated by SOI-based circuitry can dissipated efficiently. Any embodiment of the present invention may utilize its own internal electrical resistance as a resistive load, such as the embodiment illustrated here in FIGS. 9a through 9c.

Lastly, FIG. 9d (bottom view) depicts the heat dissipating structure 52 in which the leads 32 deliver power generated by the thermoelement couples to an external load 62 for consumption. As described in the background, a temperature differential experienced between the heat absorbing junctions 46 and heat rejecting junctions 48 of the structure 52 will generate a voltage (open or closed circuit) and corresponding current when connected to the external load 62. Any embodiment of the present invention may generate electrical power and deliver it to an external load, such as the embodiment illustrated here in FIG. 9d.

Figure 10A:
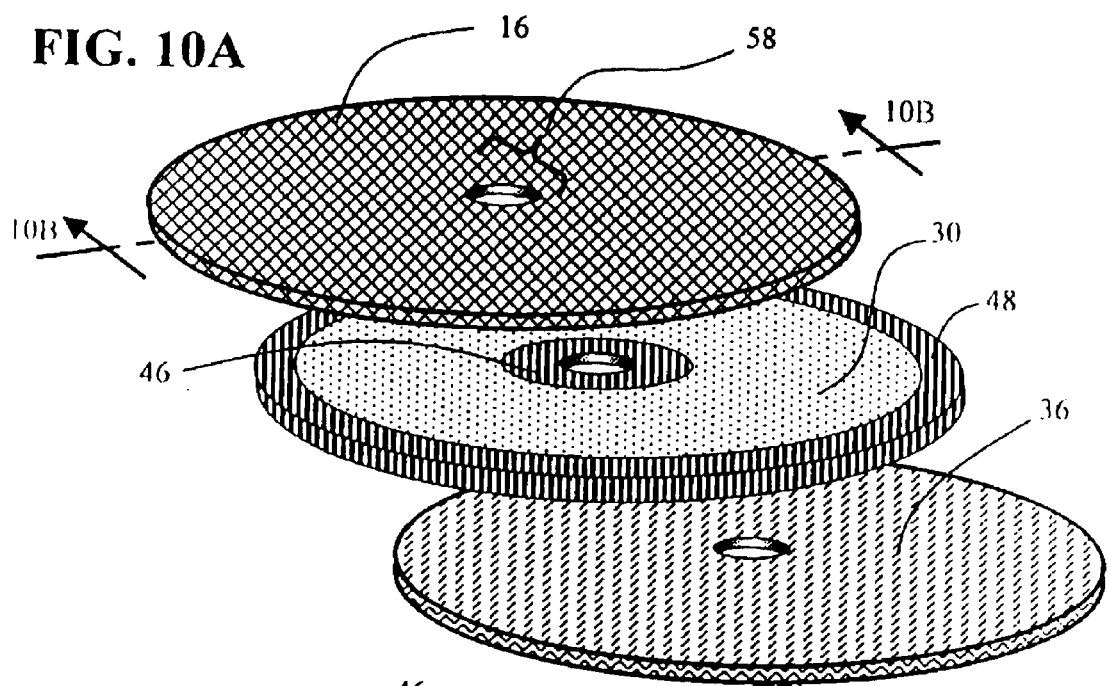
FIGS. 10a through 10c illustrate a closed circuit thermoelectric couple as one embodiment of the present invention.
Figure 10B:
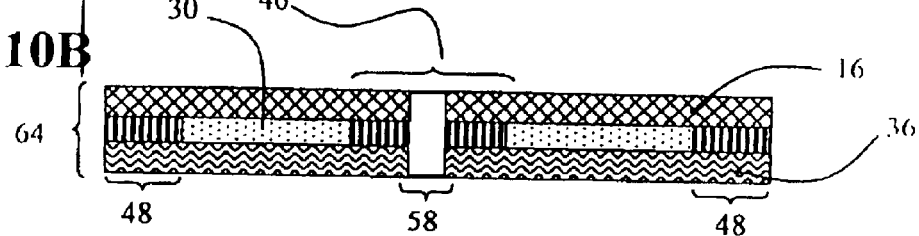
Figure 10C:
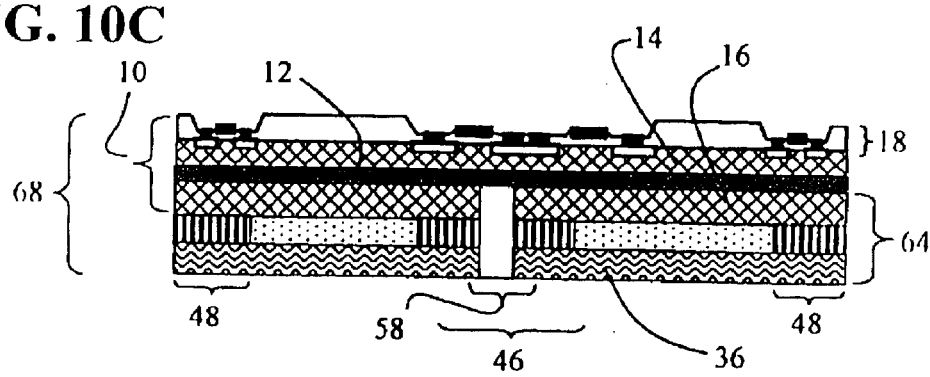

The embodiment in FIGS. 10a through 10c illustrate a multistage (or cascaded, structure including thermoelement couples thermally in series with each other) heat dissipating SOI structure comprising a thermoelement couple which is neither connected to a power source or external load.

Within FIG. 10a, the silicon substrate 16 portion of the SOI structure 10 (seen in FIG. 10c) is shown separately for clarity purposes. A heat absorbing junction 46 (near center of substrate), heat rejecting junction 48 (near perimeter of substrate) and dielectric layer 30 are (shown together also for clarity) all sandwiched between and bonded to the silicon substrate 16 and a conductor or semiconductor layer 36. A small open via 58 (which may be dielectrically filled) facilitates the electrical isolation between the heat absorbing junction 46 and heat rejecting junction 48 when bridged by the silicon substrate 16 and conductor 36.

The resultant structure, seen in FIG. 10b (a sectional view of FIG. 10a on lines 10b—10b), illustrates how the silicon substrate 16 and conductor 36 are electrically connected together at the junctions 46, 48, thus creating a closed circuit thermoelement couple structure 64.

Now, according to the Seebeck Effect, if the two dissimilar thermoelements 16, 36 are electrically joined to form two junctions, and if the temperature of each junction differs, a voltage and corresponding current will be developed. The actual electric "load" is the resistance of the heat rejecting junction 48. The resulting generated electric current will absorb heat via the Peltier Effect (at the heat absorbing junction 46) and transport it to the heat rejecting junction 48 where it will be dissipated.

FIG. 10c illustrates the complete heat dissipating SOI structure 68 comprising the closed circuit thermoelement couple structure 64 integrated with the silicon substrate 16 within the SOI structure 10. Additionally, the substrate 16 may (at least partially) be doped to yield an N-type layer in order to further increase electrical conductivity.

Figure 11A:
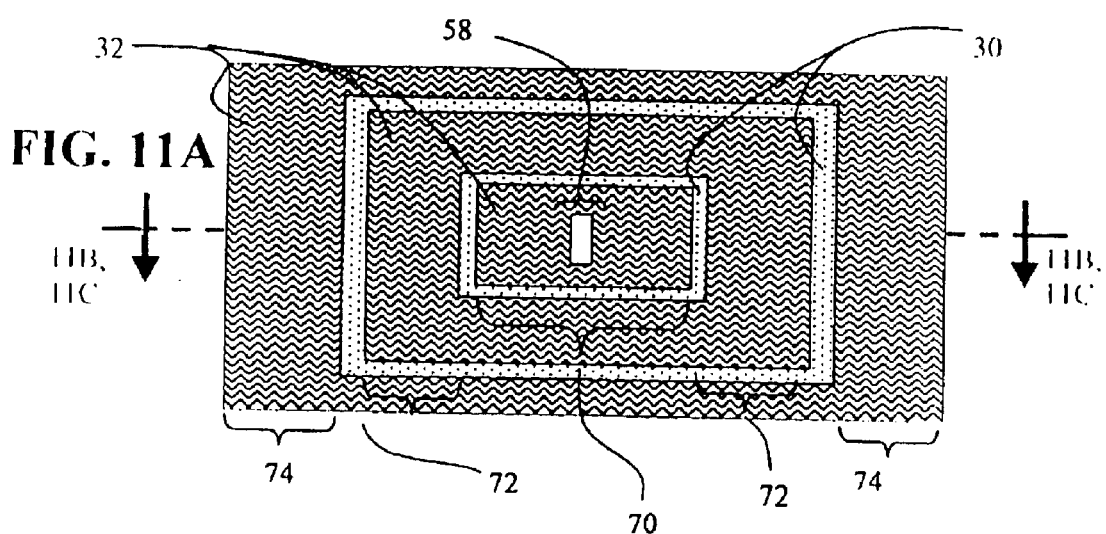
FIGS. 11a through 11c illustrate a single semiconducting thermoelement with multiple cascaded stages.
Figure 11B:
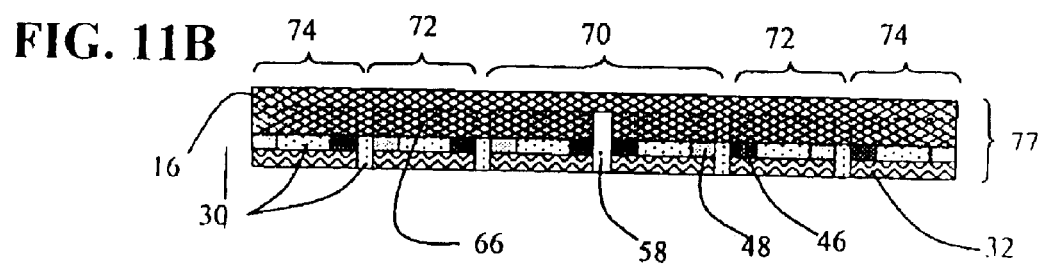
Figure 11C:
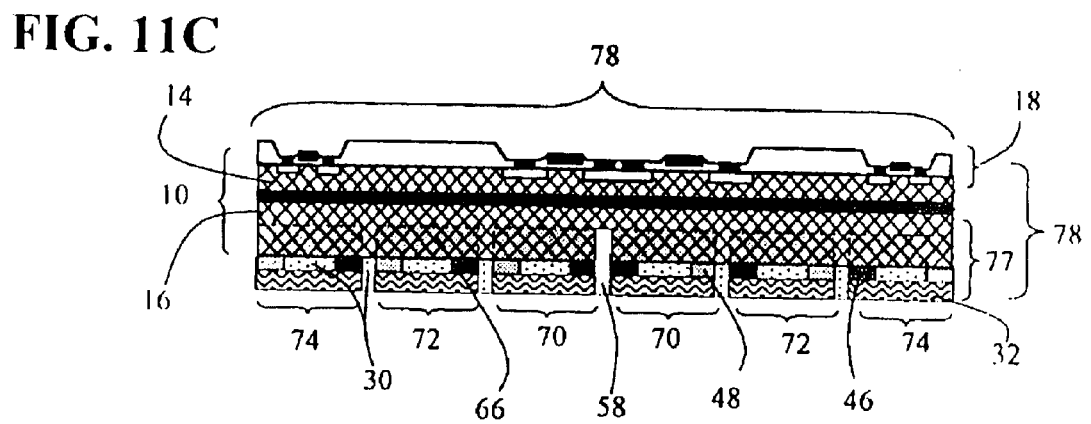

FIGS. 11a through 11c illustrate a closed circuit multistage (or cascaded, structure including thermoelement couples thermally in series with each other) heat sink/spreader structure, integrated with an SOI structure, wherein each stage comprises at least one thermoelement couple with at least one heat absorbing junction 46 near each stage center and heat rejecting junction 48 near each stage perimeter.

FIG. 11a illustrates the bottom view of the structures seen in FIGS. 11b and 11c.

Reference is now made to FIG. 11b (a sectional view of FIG. 11a on lines 11b—11b) wherein multiple regions (comprising individual stages each with one thermoelement couple) within the silicon substrate 16 are doped to yield discrete thermoelements 66 with three isolated thermoelement stages 70, 72, 74. The thermoelements 66 (in each stage 70, 72, 74) are joined with a conductor or semiconductor 32 (at the heat absorbing and heat rejecting junctions 46, 48) to yield a closed circuit structure also depicted in FIGS. 10a through 10c. A small open via 58 (which may be dielectrically filled) facilitates the electrical isolation (within stage 70) between the heat absorbing junction 46 (located near the center of each thermoelement 66, 36) and heat rejecting junction 48 (located near the perimeter of each thermoelement 66, 36) when bridged by the thermoelement 66 and dissimilar conductor 36.

It can be seen that each successive stage 70, 72, 74 is laterally displaced from the previous stage (positioned outside an entire perimeter of the previous and successive stage) and the center of the SOI structure. Electrical isolation may be provided by depletion regions established between the silicon substrate 16 and doped discrete thermoelements 66. Additionally, an oxide or nitride region electrically may isolate each discrete thermoelement 66 with stages 70, 72, 74 within the silicon substrate 16. In this embodiment, the entire substrate 16 may be doped (without separate regions) and electrically isolated by possibly implanting oxygen between each discrete thermoelement stage 70, 72, 74.

Finally, FIG. 11c (a sectional view of FIG. 11a on lines 11c—11c) depicts the complete closed circuit multistage heat dissipating SOI structure 78 (including the closed circuit multistage thermoelement couple structure 77) in which three thermoelement couple stages 70, 72, 74 are fabricated with the SOI structure's 10 silicon substrate 16.

FIGS. 12 through 15 illustrate various electronic component package types (but not limited to) which may be utilized to house the silicon substrate comprising the heat dissipating SOI structures in any embodiment of the present invention. The heat sink/spreader structures illustrated may be fabricated with the SOI structure's silicon substrate or the heat sink/spreader may be attached (via the silicon substrate) with wafer bonding techniques disclosed in the previous figures.

FIG. 12 illustrates a Chip Scale Package (CSP) 80 including an SOI structure 10 attachable to or fabricated with a heat sink/spreader structure 82 (via the silicon substrate) of the present invention. The heat absorbing junction 46, positioned near the center of the SOI structure 10 and package 82 transfers heat energy outward to the heat rejecting junction 48 which is located near the perimeter of the structure 10 and package 82.

FIG. 13 illustrates a Flip Chip Multi-Chip Module (FCMCM) package 84 wherein two SOI structures 10 are attached to a heat sink/spreader structure 82 of the present invention.

FIG. 14 illustrates a wire-bonded Tape Ball Grid Array (TBGA) package 86 in which a heat sink/spreader structure 82 comprises a cavity to which a SOI structure 10 is attached.

FIG. 15 illustrates a Flip Chip Ball Grid Array (FCBGA) package 88 wherein the heat sink/spreader structure 82 (attachable to or fabricated from the SOI structure 10) transfers heat energy from the heat absorbing junction 46 to the heat rejecting junction 48.

Several embodiments of the present invention have been described. A person skilled in the art, however, will recognize that many other embodiments are possible within the scope of the claimed invention. For this reason, the scope of the invention is not to be determined from the description of the embodiments, but must instead be determined solely from the claims that follow.

What is claimed is:

1. A heat dissipating silicon-on-insulator (SOI) structure having a buried oxide layer interposed between a silicon layer, including circuitry, and silicon substrate wherein an electrical source is connected to the silicon substrate, whereby the charge carrier flow travels in a direction from the hot region on the SOI structure outward toward the perimeter of the silicon substrate.

2. The structure in claim 1 wherein at least a portion of the silicon substrate is doped to yield an N-type region.

3. The structure in claim 1 wherein an electric via connects the silicon layer with the silicon substrate in order to provide electrical power.

4. The structure in claim 1 wherein the silicon substrate is electrically in series with an electrical load other than itself.

5. A heat dissipating silicon-on-insulator structure having a buried oxide layer interposed between a silicon layer and silicon substrate, the structure comprising:
at least one electrically conductive member attachable to the silicon substrate; and
an electrical source connected to the electrically conductive member, whereby the charge carrier flow travels in a direction from the hotter region on the SOI structure outward toward the perimeter of the silicon substrate.

6. The structure in claim 5 wherein an electric via connects the silicon layer with the silicon substrate in order to provide electrical power to the electrically conductive member.

7. The structure in claim 5 wherein the electrically conductive member is electrically in series with an electrical load other than itself.

8. The structure in claim 5 wherein the SOI structure is attached to the electrically conductive member by wafer bonding.

9. A heat dissipating silicon-on-insulator structure having a buried oxide layer interposed between a silicon layer and silicon substrate, said substrate comprising:
at least one thermoelement couple, said couple comprised of the silicon substrate and at least one dissimilar conductor electrically bonded to the silicon substrate thereby creating junctions; and
said thermoelement couple comprises at least one heat absorbing junction and at least one heat rejecting junction wherein the heat absorbing junction is positioned near the center of the SOI substrate and the heat rejecting junction is positioned near the perimeter of the substrate.

10. The structure in claim 9 wherein at least a portion of the silicon substrate is doped to yield an N-type region.

11. The structure in claim 9 wherein the dissimilar conductor comprises more than one layer.

12. The structure in claim 9 wherein an electric via connects the silicon layer with the silicon substrate in order to provide electrical power to the thermoelement couple junctions.

13. The structure in claim 9 wherein a voltage is applied to the thermoelement couple.

14. The structure in claim 9 wherein the thermoelement couple is electrically in series with an electrical load other than itself.

15. The structure in claim 9 wherein the thermoelement couple is utilized as a resistor for an electronic component.

16. The structure in claim 9 wherein a voltage and current is generated by the thermoelement couple and is consumed by an external electric load.

17. The structure in claim 9 wherein the silicon substrate and dissimilar thermoelement, comprising each thermoelement couple, is electrically bonded to each other at both the heat absorbing and heat rejecting junctions thereby creating closed electrical circuit thermoelement couples.

18. A heat dissipating silicon-on-insulator structure, the structure comprising an SOI structure consisting of a buried oxide layer interposed between a silicon layer and silicon substrate, the silicon substrate attachable to a heat sink/spreader structure comprising:
a heat sink/spreader structure wherein at least one thermoelement couple is created through the bonding between at least one semiconductor to at least one dissimilar conductor; and
the dissimilar conductor comprises at least one heat absorbing junction and at least one heat rejecting junction.

19. The structure in claim 18 wherein the heat absorbing junction is positioned near the center of the SOI substrate and the heat rejecting junction is positioned near the perimeter of the substrate.

20. The structure in claim 18 wherein the dissimilar conductor and semiconductor each comprise more than one layer.

21. The structure in claim 18, further comprising a package for housing the silicon substrate.

22. The structure in claim 18 wherein the SOI structure is attached to the heat sink/spreader structure by wafer bonding.

23. The structure in claim 18 wherein the heat sink/spreader structure face to be wafer bonded is larger in overall area than the SOI structure.

24. The structure in claim 18 wherein the heat rejecting junctions are located outside the bond line between the SOI substrate and heat sink/spreader structure.

25. The structure in claim 18 wherein the SOI structure attachment to the heat sink/spreader structure is electrically conductive.

26. The structure in claim 18 wherein a voltage is applied to the thermoelement couple.

27. The structure in claim 18 wherein the thermoelement couple is electrically in series with an electrical load other than itself.

28. The structure in claim 18 wherein the thermoelement couple is utilized as a resistive load for an electronic component.

29. The structure in claim 18 wherein a voltage and current is generated by the thermoelement couple and is consumed by an external electric load.

30. A method of manufacturing a heat dissipating silicon-on-insulator structure, the structure comprising an SOI structure consisting of a buried oxide layer interposed between a silicon layer and silicon substrate, more than one thermoelement couple, each with at least one heat absorbing and one heat rejecting junction, wherein the heat absorbing junctions are positioned near the center of the SOI substrate and the heat rejecting junctions are positioned near the perimeter of the substrate, and P-type and negative-type N-type conductivity dopants comprising:

(a) Selectively depositing the P and N-type dopants into at least one face of the substrate to form a pattern of P and N-type conductivity thermoelements within the silicon substrate;

(b) Electrically bonding the P and N-type conductivity thermoelements at heat absorbing and heat rejecting junctions to form thermoelement couples.

31. The method of claim 30 wherein a dielectric, such as oxide or nitride, is added to the physical regions between each P and N-type thermoelement in order to provide electrical insulation between each thermoelement.

32. The method of claim 30 wherein the physical regions between each P and N-type thermoelement are removed in order to provide electrical insulation between each thermoelement.

33. The method of claim 30 wherein the thermoelement couple is electrically in series with an electrical load other than itself.

34. A heat dissipating silicon-on-insulator structure, the structure comprising an SOI structure consisting of a buried oxide layer interposed between a silicon layer and silicon substrate, more than one thermoelement couple stage, each stage containing at least one thermoelement couple, each with at least one heat absorbing and heat rejecting junction, wherein each heat absorbing junction is positioned near the center of each thermoelement couple stage and heat rejecting junction is positioned near the perimeter of each stage and all thermoelement couple stages are fabricated within at least one silicon substrate.

35. The structure in claim 34 wherein each stage is positioned outside the entire perimeter of the previous stage and each successive stage.

36. The structure in claim 34 wherein a dielectric, such as oxide or nitride, is added to the physical regions between each thermoelement stage in order to provide electrical insulation between each thermoelement.

37. The structure in claim 34 wherein the thermoelement couple is electrically in series with an electrical load other than itself.

38. The structure in claim 34 wherein each dissimilar thermoelement, comprising each thermoelement couple, is electrically bonded to each other at both the heat absorbing and heat rejecting junctions thereby creating closed electrical circuit thermoelement couples.

39. A method of manufacturing a heat dissipating silicon-on-insulator wafer, the wafer includes a top silicon wafer and bottom silicon wafer wherein the bottom wafer comprises at least one thermoelement couple, the couple includes at least two dissimilar thermoelements with at least one heat absorbing and more one heat rejecting junction comprising the steps of:

(a) Applying an oxide layer between the top silicon wafer and the bottom silicon wafer;

(b) Wafer bonding the top silicon wafer to the bottom silicon wafer via the oxide layer.

40. The method of claim 39 wherein the heat dissipating silicon-on-insulator wafer comprises more than one die.

41. The method of claim 39 wherein the heat absorbing junctions are positioned near the center of at least one bottom silicon wafer die and the heat rejecting junctions are positioned near the perimeter of at least one bottom silicon wafer die.

42. The method of claim 39 wherein the thermoelement couple is formed by selectively depositing the P and N-type dopants into at least one face of the bottom silicon wafer to form a pattern of P and N-type conductivity thermoelements within at least one bottom silicon wafer die.

43. The method of claim 39 wherein the P and N-type conductivity thermoelements are electrically bonded at heat absorbing and heat rejecting junctions to form at least one thermoelement couple within at least one bottom silicon wafer die.

44. The method of claim 39 wherein at least one bottom silicon wafer die contains more than one thermoelement couple stage.

45. The method of claim 39 wherein each successive thermoelement couple stage is laterally displaced from the previous stage and the center of at least one bottom silicon wafer die.

46. The method of claim 39 wherein each stage is positioned outside the entire perimeter of the previous stage and each successive stage.

47. The method of claim 39 wherein a voltage is applied to at least one thermoelement couple.

48. The method of claim 39 wherein the thermoelement couple is electrically in series with an electrical load other than itself.

49. The method of claim 39 wherein the thermoelement couple is utilized as a resistive load for an electronic component.

50. The method of claim 39 wherein a voltage and current is generated by at least one thermoelement couple and is consumed by an external electric load.

* * * * *